(12) United States Patent
Kim et al.

(10) Patent No.: US 8,275,250 B2
(45) Date of Patent: Sep. 25, 2012

(54) ZOOM SWITCH ASSEMBLY, IMAGE PHOTOGRAPHING APPARATUS HAVING THE SAME, AND METHOD OF CONTROLLING ZOOM LENS

(75) Inventors: Koang-soo Kim, Suwon-si (KR); Soon-min Hong, Seoul (KR); Gyun Heo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/909,918

(22) Filed: Oct. 22, 2010

(65) Prior Publication Data

US 2011/0116778 A1    May 19, 2011

(30) Foreign Application Priority Data

Nov. 13, 2009  (KR) .............................. 2009-109682

(51) Int. Cl.
*G03B 17/00*   (2006.01)

(52) U.S. Cl. .......................................... 396/85; 396/543

(58) Field of Classification Search .............. 396/85–87, 396/543; 200/560
See application file for complete search history.

(56) References Cited

U.S. PATENT DOCUMENTS

| 5,198,847 | A | * | 3/1993 | Takahashi | ....................... 396/86 |
| 5,678,074 | A | * | 10/1997 | Mori et al. | .................... 396/131 |
| 6,018,632 | A | * | 1/2000 | Takamura | ....................... 396/85 |
| 2002/0098002 | A1 | * | 7/2002 | Li et al. | ......................... 396/543 |

* cited by examiner

*Primary Examiner* — W. B. Perkey
(74) *Attorney, Agent, or Firm* — Stanzione & Kim, LLP

(57) ABSTRACT

A zoom switch assembly for an image photographing apparatus includes a fixing member which includes a flat unit, a rotating member which is mounted rotatably with respect to the fixing member, an electric conductivity unit which is mounted on the rotating member to rotate opposite the flat member, and a position detection pattern which is formed along a rotation trace of the electric conductivity unit on the flat unit of the fixing member, and through which electricity flows selectively according to a rotation angle of the electric conductivity unit.

36 Claims, 16 Drawing Sheets

ZOOM SWITCH ASSEMBLY, IMAGE PHOTOGRAPHING APPARATUS HAVING THE SAME, AND METHOD OF CONTROLLING ZOOM LENS

CROSS-REFERENCE TO RELATED APPLICATIONS

This application claims the benefit of priority under 35 U.S.C. §119(a) from Korean Patent Application No. 2009-109682, filed on Nov. 13, 2009, in the Korean Intellectual Property Office, the contents of which are incorporated herein by reference in their entirety.

BACKGROUND

1. Field of the Invention

The present general inventive concept relates to an image photographing apparatus, and more particularly, to a zoom switch assembly to control a zoom lens of an image photographing apparatus, an image photographing apparatus having the same, and a method of controlling a zoom lens.

2. Description of the Related Art

Usually, an image photographing apparatus such as a digital still camera or a camcorder photographs and records a desired image as a still image or a motion image and plays back the image.

Such an image photographing apparatus includes a zoom lens assembly so that an object located a long distance away from the zoom lens assembly appears to be a short distance away. The zoom lens assembly includes a zoom switch assembly to perform a zoom operation, that is, tele/wide (T/W) function, by moving the zoom lens.

The zoom switch assembly includes a knob that a user manipulates. The control unit of the image photographing apparatus determines the position of the knob of the zoom switch assembly using variation of resistance, and adjusts the zoom motor which drives the zoom lens according to the position of the knob in order to control the position of the zoom lens.

The conventional zoom switch assembly moves a brush formed integrally with the knob on a carbon plate with friction to cause the resistance of the zoom switch to be varied according to the position of the knob. The control unit of the image photographing apparatus may determine the position of the knob by measuring the resistance of the zoom switch.

However, in the conventional zoom switch assembly, since the brush made of stainless steel (SUS) causes friction with the carbon plate, there is a problem that a surface of the carbon plate is scratched.

In addition, the conventional zoom switch assembly requires a lot of components in order to assemble the carbon plate and the brush which are formed as separate modules, thereby causing difficulty in assembling.

As the conventional zoom switch assembly uses resistance on a contacting surface between the brush and the carbon plate to adjust the zoom lens, the brush must maintain the constant pressure against the carbon plate in order to accurately control the zoom switch assembly. However, the elastic member which maintains pressure between the brush and the carbon plate at a constant level may be deformed if the zoom switch assembly is used for long periods of time, and thus the pressure may be changed. The change of the pressure of the brush causes the resistance to be changed, thereby causing the difficulty in precisely controlling the zoom lens.

Accordingly, a zoom switch assembly is needed which can resolve the problem on the conventional zoom switch assembly.

SUMMARY

The present general inventive concept provides a zoom switch assembly to detect the position of a rotating member or a knob using an electrical conduction method, an image photographing apparatus having the same, and a method of controlling a zoom lens.

Additional features and utilities of the present general inventive concept will be set forth in part in the description which follows and, in part, will be obvious from the description, or may be learned by practice of the general inventive concept.

Features and/or utilities of the present general inventive concept may be achieved by providing a zoom switch assembly for an image photographing apparatus, including a fixing member which includes a flat unit, a rotating member which is formed rotatably with respect to the fixing member, an electric conductivity unit which is mounted on the rotating member, and, if the rotating member rotates, rotates to be opposed to the flat member, and a position detection pattern which is formed along a rotation trace of the electric conductivity unit on the flat unit of the fixing member, and on which electricity flows selectively according to a rotation angle of the electric conductivity unit.

The position detection pattern may include a ground which is formed on a side of the rotation trace, and a plurality of position detection points which are formed on the other side of the rotation trace and are spaced apart from the ground along the rotation trace, wherein the electric conductivity unit causes electricity to flow between at least one of the plurality of position detection points and the ground.

The plurality of position detection points may be formed at interval of 5 degrees.

The fixing member may include a supporting member on which the flat unit is formed and a base which fixes the supporting member.

The rotating member may include a shaft which is mounted rotatably on the flat unit in a vertical direction, a rotating wing which protrudes from the shaft and supports the electric conductivity unit, and a knob which is formed to rotate integrally with the shaft.

The rotating wing may be formed in a molding manner, and the electric conductivity unit may be formed in a manner of printing metal material on the rotating wing.

The fixing member may be formed in a molding manner, and the position detection pattern may be formed in a manner of printing metal material on the fixing member.

The position detection pattern may be formed on a position detection substrate, and the position detection substrate may be detachably mounted on the fixing member.

Features and/or utilities of the present general inventive concept may also be achieved by a zoom switch assembly for an image photographing apparatus, including a supporting member which includes a flat unit, a shaft which is rotatably mounted on the flat unit in a vertical direction, a knob which is formed to rotate integrally with the shaft and to rotate with respect to the supporting member, a position detection pattern which is formed on the flat unit of the supporting member and comprises grounds and a plurality of position detection points, wherein the grounds are formed in a circular arc shape to surround the shaft and the plurality of position detection points are formed apart from the grounds in the radial direction of the shaft and are formed apart from each other in the circumferential direction of the circle having the shaft as a center. The zoom switch assembly may further include a rotating wing which is configured integrally with the shaft and includes an electric conductivity unit to electrically connect the grounds and at least one of the plurality of position detection points of the position detection pattern, wherein if the knob rotates, the electric conductivity unit may rotate, and thus change, among the plurality of position detection points which are connected to the ground.

The position detection pattern may be symmetrical with respect to a line which passes through the shaft and divides the flat unit in half.

The rotating wing may be symmetrical with respect to the shaft, and the two electric conductivity units may be symmetrical with respect to the shaft.

The zoom switch assembly for the image photographing apparatus may further include a subsidiary supporting member which is mounted to be opposed to the flat unit of the supporting member and supports the other end of the shaft, and a base which is mounted below the supporting member and the subsidiary supporting member.

The zoom switch assembly for the image photographing apparatus may further include an elastic member which presses the electric conductivity unit toward the flat unit of the supporting member.

The position detection pattern may be formed by printing, plating, and stamping.

Features and/or utilities of the present general inventive concept may also be achieved by an image photographing apparatus, including a body of the image photographing apparatus, a zoom lens assembly which is mounted on the body. The zoom motor which is mounted on the body and drives the zoom lens assembly, and a zoom switch assembly which is mounted on the body, wherein the zoom switch assembly may include a fixing member which includes a flat unit, a rotating member which is rotatably mounted with respect to the fixing member, an electric conductivity unit which is mounted on the fixing member, and, if the rotating member rotates, rotates to be opposed to the flat unit, and a position detection pattern which is formed on the flat unit of the fixing member along a rotation trace of the electric conductivity unit, and on which electricity flows selectively according to a rotation angle of the electric conductivity unit, and a control unit which is mounted on the body, detects the position of the electric conductivity unit of the zoom switch assembly, and controls the zoom motor according to the position of the electric conductivity unit.

Features and/or utilities of the present general inventive concept may also be achieved by a method of controlling a zoom lens of an image photographing apparatus, the method including causing a rotating member of a zoom switch assembly to rotate, determining on which position detection point, among a plurality of position detection points of a fixing member of the zoom switch assembly, electricity flows, and controlling a zoom motor according to the position detection point on which electricity flows.

The rotation speed and the rotation direction of the zoom motor may be controlled according to the position detection point on which electricity flows.

The zoom switch assembly according to an exemplary embodiment of the present general inventive concept may be configured in a manner of printing the position detection pattern and the electric conductivity unit on the supporting member and the rotating member. Therefore, the zoom switch assembly requires fewer components than that of the conventional zoom switch assembly, and thus it is easy to assemble the components.

In the zoom switch assembly and the image photographing apparatus according to an exemplary embodiment of the present general inventive concept, the position of the rotating member of the knob is detected using an electrical conductivity method, not the conventional resistance method. Therefore, the zoom lens is accurately controlled even when the zoom switch assembly is used for long periods of time.

The zoom switch assembly according to an exemplary embodiment of the present general inventive concept employs the electric conductivity unit and the position detection pattern which are made of the same material, and thus the electric conductivity unit does not scratch the position detection pattern, thereby enhancing reliability of the position detection pattern.

Features and/or utilities of the present general inventive concept may also be realized by an image zoom switch of an image capture apparatus including a first surface that is fixed with respect to the image capture apparatus, and a second surface opposite the first surface to rotate with respect to the first surface. One of the first and second surfaces may include a position detection pattern including a plurality of position detection points and at least one ground pad, and the other of the first and second surfaces may include at least one electrically conductive unit to connect the detection points to the at least one ground pad, respectively, such that a different detection point is connected to the at least one ground pad when the second surface is at a different rotation angle with respect to the first surface.

The position detection pattern may be located on the first surface and the at least one electrically conductive unit may be located on the second surface.

The image zoom switch further may include a base mounted to the image capture apparatus, and the first surface may be a substantially flat surface that extends substantially perpendicularly from the base.

The base may be mounted to the image capture apparatus so that a lower surface of the base contacts the image capture apparatus, and the first surface may include electrically conductive connection lines extending from each of the plurality of position detection points and from the at least one ground pad to respective contact points located on a lower surface of the base.

The image zoom switch further may include a shaft mounted to one of the first and second surfaces to extend substantially perpendicularly from the one of the first and second surfaces, the other of the first and second surfaces may include a hole to receive the shaft, and the shaft may rotate within the hole.

The position detection pattern may include a plurality of first position detection points and a first ground pad located on a first side of the first surface and a plurality of second position detection points and a second ground pad located on a second side of the first surface opposite the first side.

The first position detection points and first ground pad may be located on one side of the shaft and the second position detection points and the second ground pad may be located on the other side of the shaft.

The plurality of first and second detection points may be located at equal distances from a center of the shaft.

The first and second ground pads may span a length corresponding to the plurality of first and second position detection points, respectively, such that the at least one electrically conductive unit contacts a different first or second detection point and a same first or second ground pad, respectively, as the second surface rotates with respect to the first surface.

Each of the first and second position detection points may be located on a same side of an imaginary line bisecting the shaft.

The position detection pattern further may include a rest state detection point located on the imaginary line, the rest state detection point being a different detection point than the first and second pluralities of detection points.

Each of the plurality of first detection points may be located an equal distance from each adjacent first detection point and each of the plurality of second detection points may be located an equal distance from each adjacent second detection point.

The at least one electrically conductive unit may include a first electrically conductive unit to connect one respective first position detection point with the first ground pad, and a second electrically conductive unit to connect one respective second position detection point with the second ground pad.

The first electrically conductive unit may connect one respective first position detection point to the first ground pad when the second surface is rotated at a negative angle with respect to an imaginary line bisecting the shaft, and the second electrically conductive unit may connect one respective second position detection point to the second ground pad when the second surface is rotated at a positive angle with respect to the imaginary line.

The image zoom switch further may include a knob connected to and fixed with respect to the second surface, to receive a user force and to rotate the second surface in response to the received user force.

Features and/or utilities of the present general inventive concept may also be realized by an image capture apparatus including an image signal processing unit to receive light and to output an image signal corresponding to the received light, a zoom lens unit to pass the received light from outside the image capture apparatus to the image signal processing unit via at least one lens, a zoom switch unit to adjust a zoom of the zoom lens unit, and a controller to receive a zoom input from the zoom switch unit and to control the zoom of the zoom lens according to the received zoom input. The zoom switch unit may include a first surface that is fixed with respect to the image capture apparatus, and a second surface opposite the first surface to rotate with respect to the first surface. One of the first and second surfaces may include a position detection pattern including a plurality of position detection points and at least one ground pad, and the other of the first and second surfaces may include at least one electrically conductive unit to connect the detection points to the at least one ground pad, respectively, such that a different detection point may be connected to the at least one ground pad when the second surface is at a different rotation angle with respect to the first surface.

The position detection pattern may include a plurality of first position detection points and a first ground pad located on a first side of the first surface, the electrically conductive unit may separately contact each one of the plurality of first position detection points and contacts the first ground pad as the second surface is rotated with respect to the first surface, and the controller may adjust a speed of a zoom function of the zoom lens based on which of the first position detection points is electrically connected to the first ground pad.

When a rest state angle is defined as an angle at which the second surface is not rotated with respect to the first surface, the controller may increase the speed of the zoom function of the zoom lens as the rotation angle of the second surface with respect to the first surface increases with respect to the rest state angle.

Features and/or utilities of the present general inventive concept may also be realized by a method of controlling a zoom of an image capture apparatus, the method including detecting an electrical connection between a ground pad and one of a plurality of position detection points, and outputting a zoom control signal based on the one of the plurality of position detection points connected to the ground pad.

The image capture apparatus may include a first surface that may be fixed with respect to the image capture apparatus, and a second surface opposite the first surface to rotate with respect to the first surface, one of the first and second surfaces may include the plurality of position detection points and the ground pad, and the method further may include, when a rest state angle is defined as an angle at which the second surface is not rotated with respect to the first surface, outputting zoom control signal to increase a zoom rate as the rotation angle of the second surface with respect to the first surface increases with respect to the rest state angle.

The method further may include receiving a user input to rotate the second surface with respect to the first surface.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
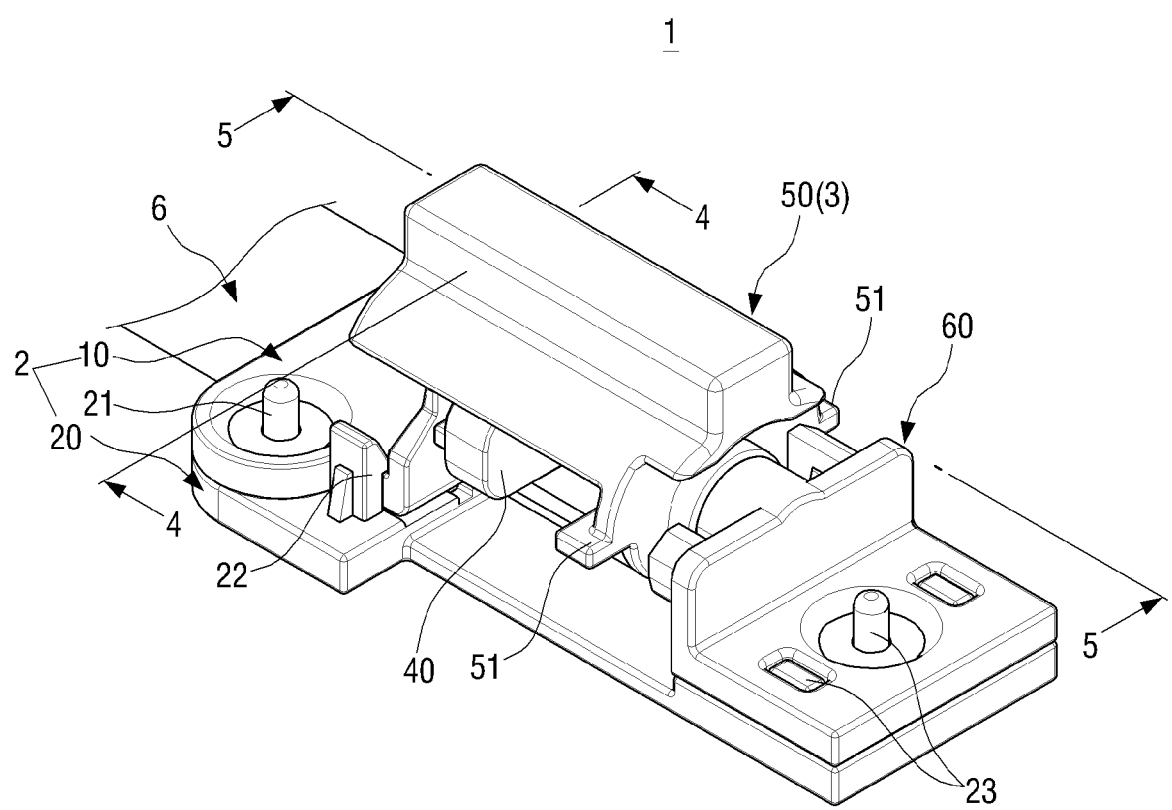
FIG. 1 is a perspective view illustrating a zoom switch assembly for an image photographing apparatus according to an exemplary embodiment of the present general inventive concept.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
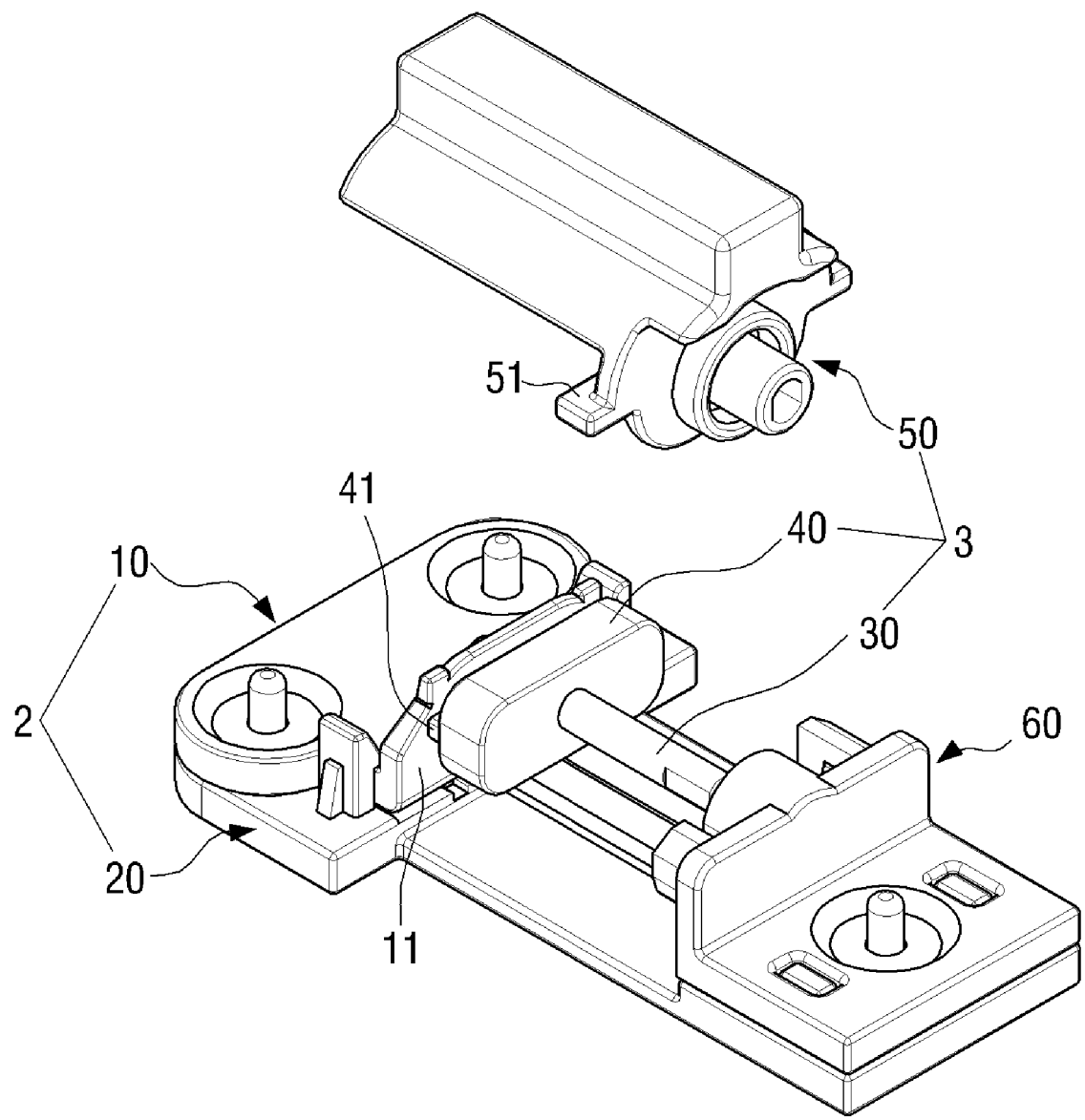
FIG. 2 is an exploded perspective view illustrating the zoom switch assembly of FIG. 1 from which a knob is detached, according to an exemplary embodiment of the present general inventive concept.
Figure 3:
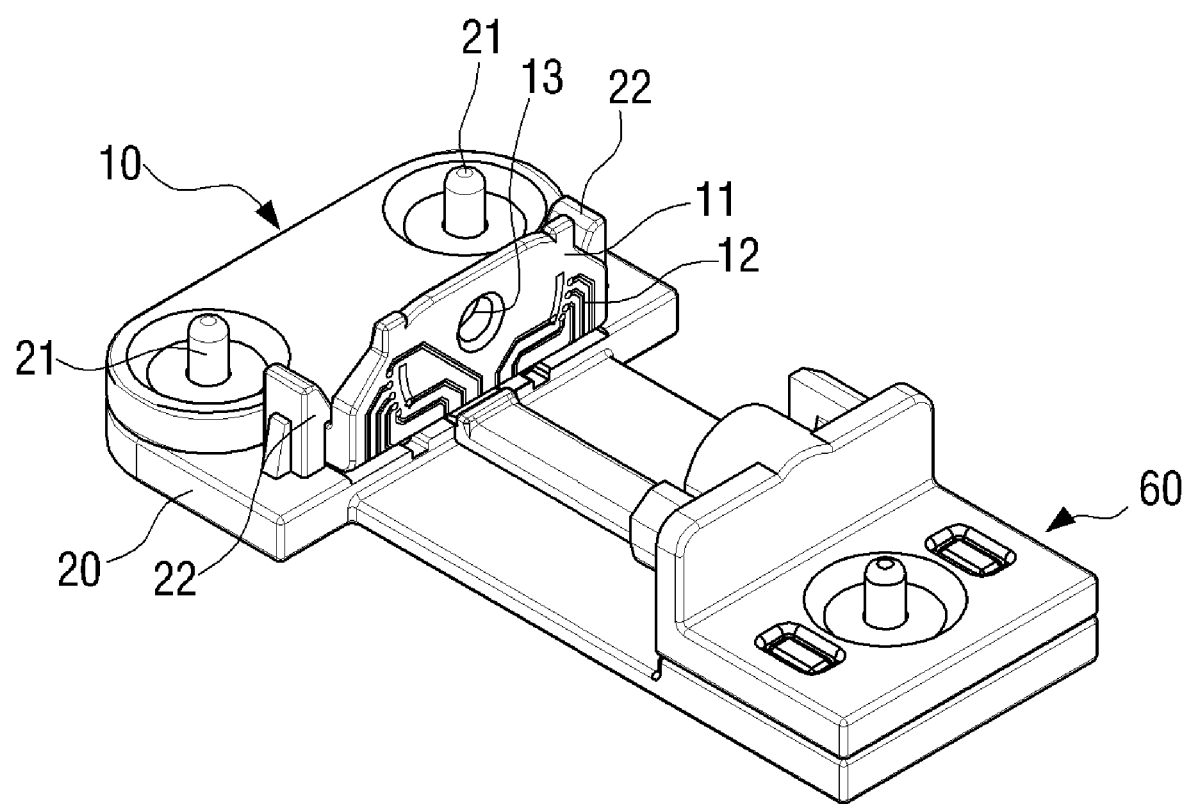
FIG. 3 is a perspective view illustrating a supporting member and a base of the zoom switch assembly of FIG. 1, according to an exemplary embodiment of the present general inventive concept.
Figure 4:
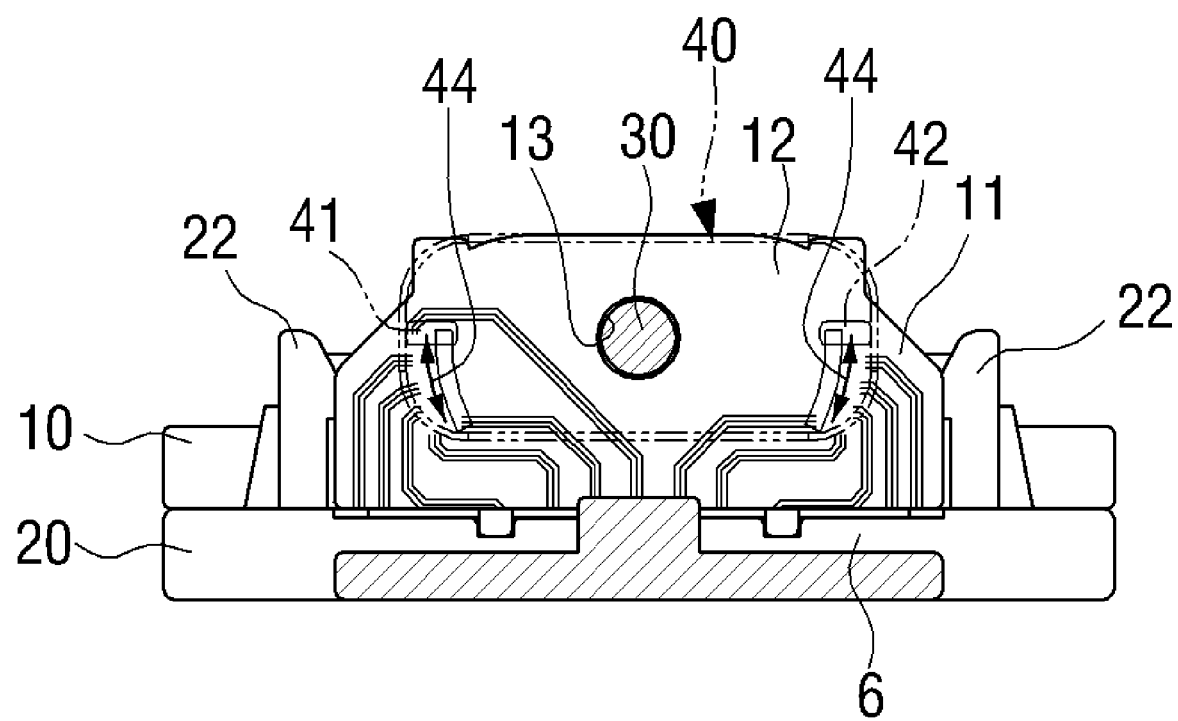
FIG. 4 is a sectional view taken along line 4-4 on the zoom switch assembly of FIG. 1.
Figure 5:
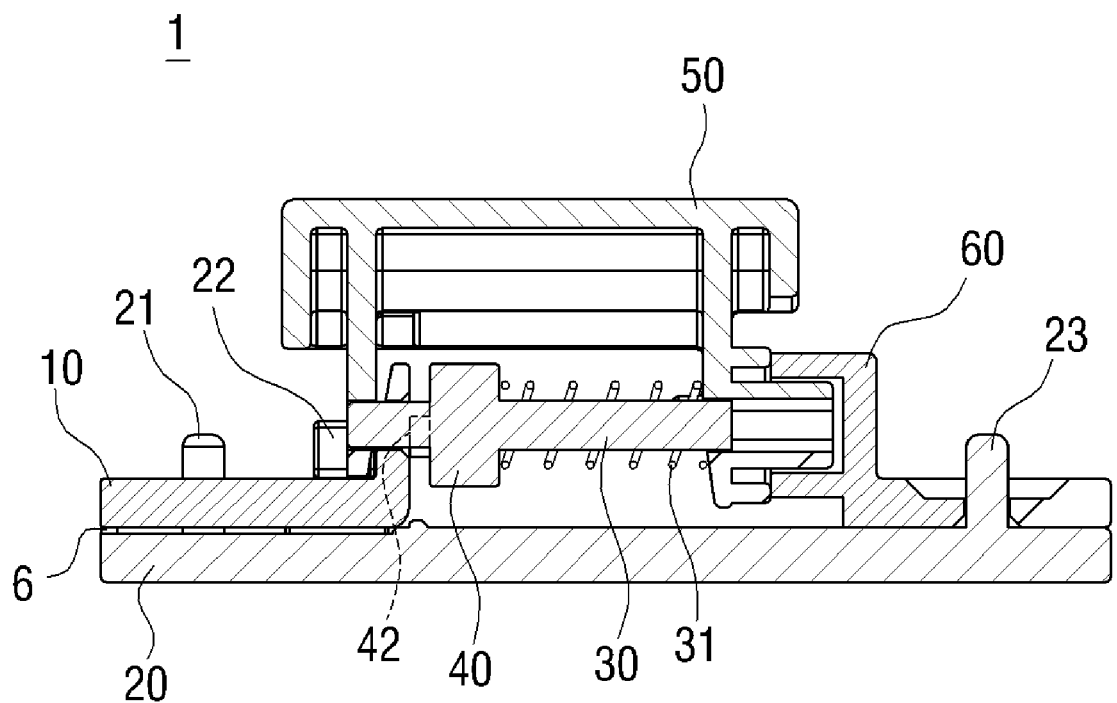
FIG. 5 is a sectional view taken along line 5-5 on the zoom switch assembly of FIG. 1.

FIG. 1 is a perspective view illustrating a zoom switch assembly for an image photographing apparatus according to an exemplary embodiment of the present general inventive concept, FIG. 2 is an exploded perspective view illustrating the zoom switch assembly of FIG. 1 from which a knob is detached, FIG. 3 is a perspective view illustrating a supporting member and a base of a zoom switch assembly, FIG. 4 is a sectional view taken along line 4-4 on the zoom switch assembly of FIG. 1, FIG. 5 is a sectional view taken along line 5-5 on the zoom switch assembly of FIG. 1.

Referring to FIGS. 1 to 5, a zoom switch assembly 1 for an image photographing apparatus, or an image capture apparatus, according to an exemplary embodiment of the present general inventive concept includes a fixing member 2 and a rotating member 3.

The fixing member 2 causes the zoom switch assembly 1 to be fixed on a body of an image photographing apparatus 100 (see FIG. 8) and thus not to move, and supports the rotating member 3 to rotate. The fixing member 2 may include a base 20 and a supporting member 10.

The base 20 is configured in a plate shape, and fixes the supporting member 10. Two pins 21 and two hooks 22 are separately disposed on the base 20 to fix the supporting member 10 on the base 20 as shown in FIG. 3. A flexible printed circuit (FPC) 6 which is connected to a control unit 190 (see FIG. 8) of the image photographing apparatus 100 is fixed between the base 20 and the supporting member 10.

The supporting member 10 is disposed on the base 20 as described above, and includes a flat unit or member 11 on which a position detection pattern 12 is formed. In this exemplary embodiment of the present general inventive concept, the supporting member 10 is configured in "L" letter shape, but the shape of the supporting member 10 is not limited thereto. The supporting member 10 may be configured as various shapes having the flat unit 11 where the position detection pattern 12 may be formed. Two holes 18 into which the pin 21 of the base 20 is inserted and two protrusions 17 which are inserted into a reference hole (not shown) of the base 20 are formed on a bottom surface 19 of the supporting member 10 to fix the supporting member 10 on the base 20 as shown in FIG. 6.

The position detection pattern 12 includes a plurality of position detection points L1-L4 and R1-R4 and grounds LG and RG formed along a rotation trace 44 of first and second electric conductivity units 41, 42 so that the first and second electric conductivity units 41, 42 of the rotating member 3 to be explained later selectively establish electrical connection between the position detection pattern 12 and the ground RG and LG. FIG. 6 shows an example of the supporting member 10 where the position detection pattern 12 is formed.

Figure 6:
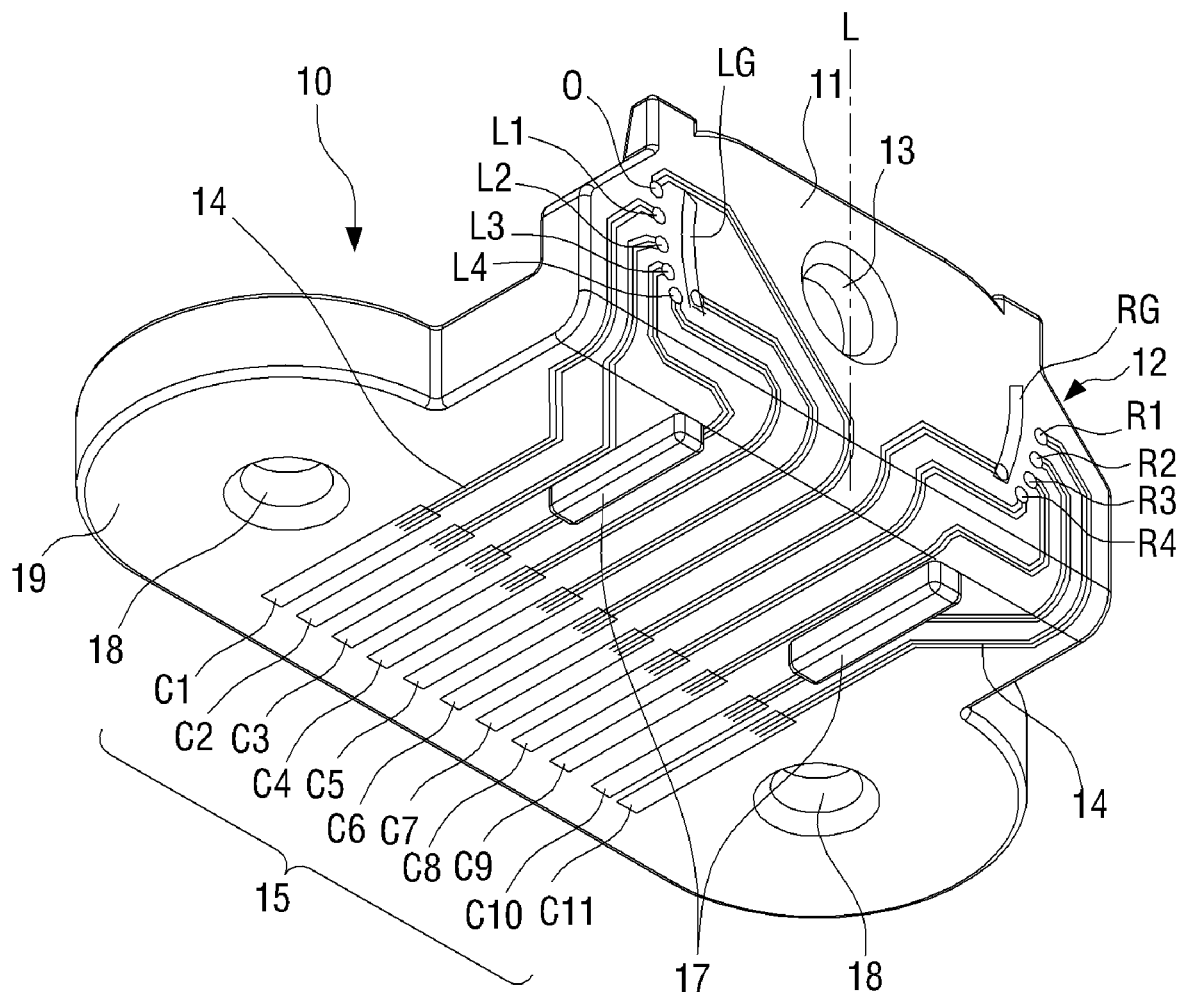
FIG. 6 is a perspective view illustrating a supporting member of the zoom switch assembly of FIG. 1.
Figure 9:
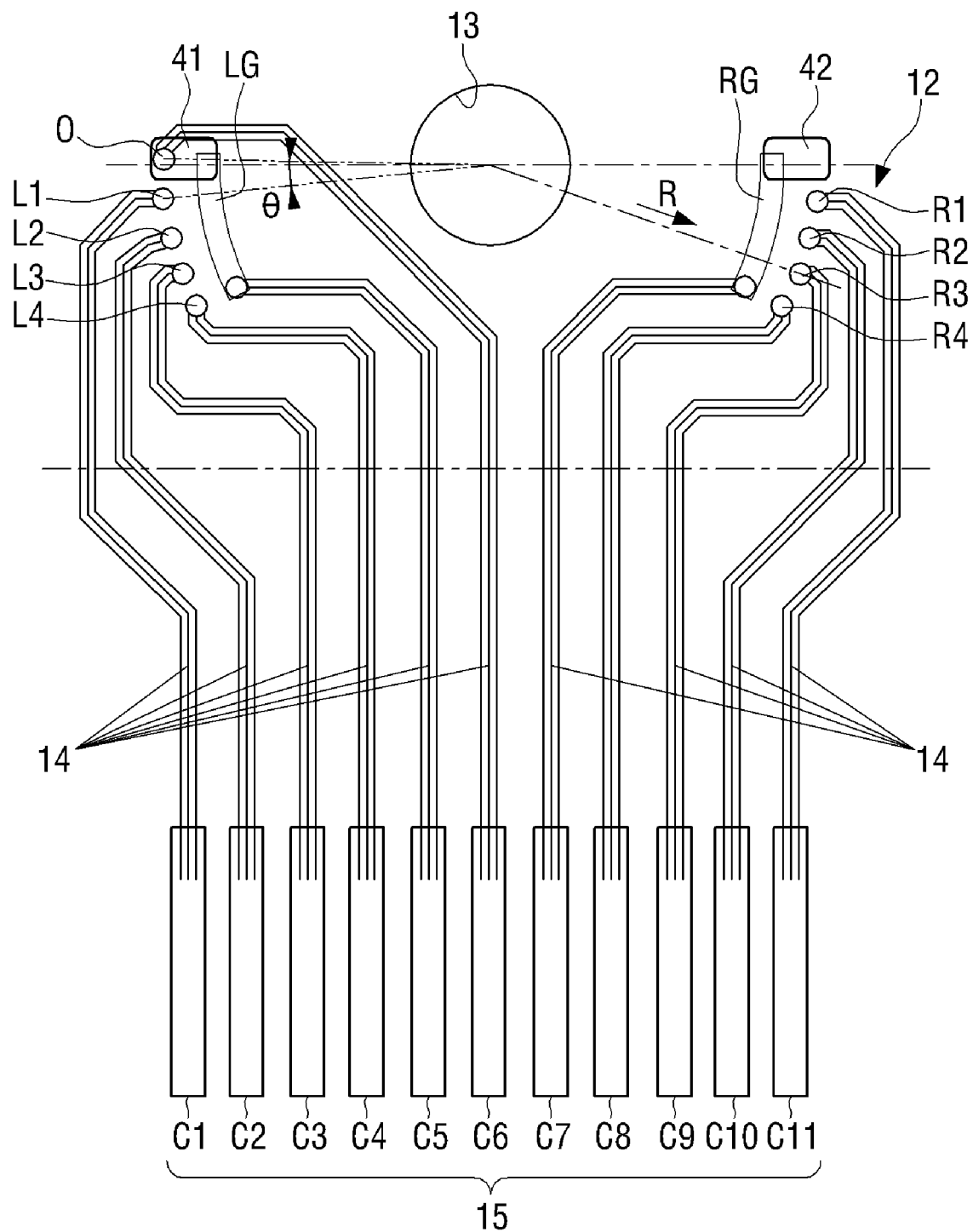
FIG. 9 is a view illustrating the relationship between a position detection pattern and an electric conductivity unit when a knob is positioned in its original position in a zoom switch assembly according to an exemplary embodiment of the present general inventive concept.

Referring to FIGS. 6 and 9, the position detection pattern 12 includes left and right grounds LG, RG and a plurality of position detection points 0, L1, L2, L3, L4, R1, R2, R3, R4 formed on the flat unit 11 of the supporting member 10. The left and right grounds LG, RG are formed in a substantial circular arc to surround a shaft hole 13 into which a shaft 30 is inserted. The left and right grounds LG, RG are disposed apart from the shaft hole 13 at a predetermined distance, and formed in a bent band. The plurality of position detection points 0, L1, L2, L3, L4, R1, R2, R3, R4 are formed apart from the left and right grounds LG, RG with respect to the shaft hole 13 at a predetermined distance in the radial direction of the left and right grounds LG, RG (referring to arrow R of FIG. 9). The distance between the left and right grounds LG, RG and the position detection points 0, L1, L2, L3, L4, R1, R2, R3, R4 is formed so that the first and second electric conductivity units 41, 42 of the rotating member 3 connect the left and right grounds LG, RG to the position detection points 0, L1, L2, L3, L4, R1, R2, R3, R4 and thus electricity flows between the left and right grounds LG, RG and the position detection points 0, L1, L2, L3, L4, R1, R2, R3, R4. The plurality of position detection points 0, L1, L2, L3, L4, R1, R2, R3, R4 are formed apart from each other in the circumferential direction of the circle having the shaft hole 13 as a center, that is, along the left and right grounds LG, RG. In other words, the left and right grounds LG, RG are formed at a side of the virtual rotation trace 44 which the first and second electric conductivity units 41, 42 of the rotating member 3 draw while the rotating member 3 rotates, and the plurality of position detection points 0, L1, L2, L3, L4, R1, R2, R3, R4 are formed at the other side of the rotation trace 44 of the first and second electric conductivity units 41, 42 to be opposed to the left and right grounds LG, RG at a predetermined distance. The plurality of position detection points 0, L1, L2, L3, L4, R1, R2, R3, R4 are disposed apart from each other along the rotation trace 44. In this exemplary embodiment of the present general inventive concept, the left and right grounds LG, RG are disposed inside the circular arc which is the rotation trace 44 of the first and second electric conductivity units 41, 42, and the plurality of position detection points 0, L1, L2, L3, L4, R1, R2, R3, R4 are disposed outside the rotation trace 44. The interval (θ) between the plurality of position detection points 0, L1, L2, L3, L4, R1, R2, R3, R4 may be set variously as occasion demands, but the exemplary embodiment of the present general inventive concept sets the interval by 5 degrees.

Figure 10:
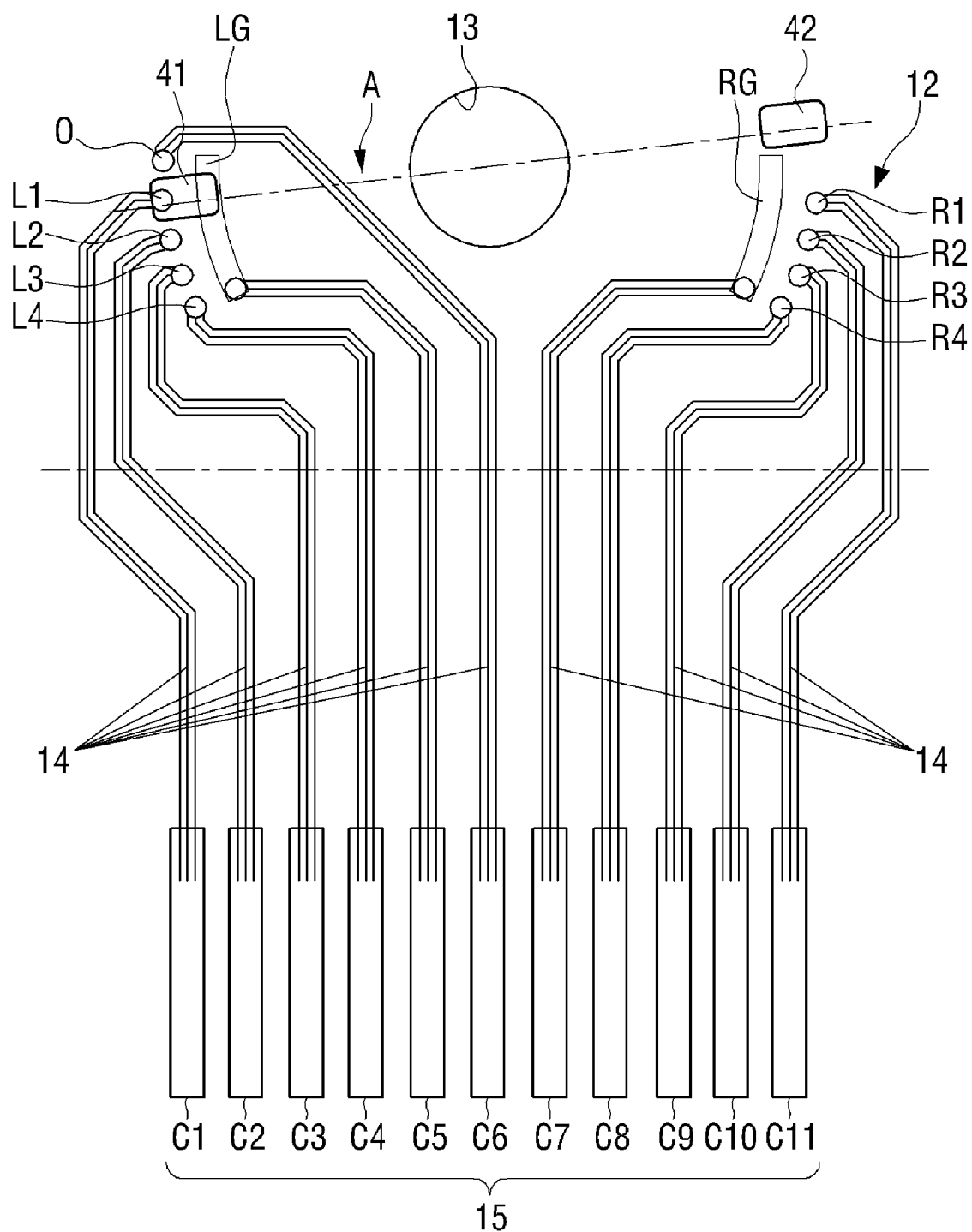
FIG. 10 is a view illustrating the relationship between a position detection pattern and an electric conductivity unit when a knob performs a telescope function in a zoom switch assembly according to an exemplary embodiment of the present general inventive concept.

Referring to FIGS. 6 and 9 again, the position detection pattern 12 is substantially symmetrical with respect to a line L which passes through the shaft 30, that is, the center of the shaft hole 13 into which the shaft 30 is inserted, and divides the flat unit 11 in half. That is, in FIG. 6, the left ground LG and the five position detection points 0, L1, L2, L3, L4 are formed on a left side of the shaft hole 13, and the right ground RG and the four position detection points R1, R2, R3, R4 are formed on a right side of the shaft hole 13. The left ground LG and the four position detection points L1, L2, L3, L4 in FIG. 6 may be symmetrical to the right ground RG and the four position detection points R1, R2, R3, R4 with respect to the line L. A connection line 14 connects each one of the left and right grounds LG, RG and the position detection points 0, L1, L2, L3, L4, R1, R2, R3, R4 to each one of a plurality of contact points 15 formed on the bottom surface 19 of the supporting member 10, one by one. In this exemplary embodiment of the present general inventive concept, the eleven contact points C1, C2, C3, C4, C5, C6, C7, C8, C9, C10, C11 are formed on the bottom surface 19 of the supporting member 10, and each one is connected to each one of the left and right grounds LG, RG, and the nine position detection points 0, L1, L2, L3, L4, R1, R2, R3, R4, one by one. The plurality of contact points 15 formed on the bottom surface 19 of the supporting member 10 are connected to the FPC 6 disposed between the supporting member 10 and the base 20. Therefore, if the first and second electric conductivity units 41, 42 connect one of the plurality of position detection points 0, L1, L2, L3, L4, R1, R2, R3, R4 to the left or right ground LG, RG, electricity flows between the corresponding two contact points 15, and thus the control unit 190 determines the position of a knob 50 of the rotating member 3. For example, if the electric conductivity unit 41 connects the left first position detection point L1 to the left ground LG as illustrated in FIG. 10, electricity flows between the contact point C1 connected to the left first position detection point L1 and the contact point C5 connected to the left ground LG, and thus the control unit 190 may recognize that the knob 50 of the rotating member 3 is disposed on the left first position detection point L1.

The position detection pattern 12 may be formed in such a manner that metal material such as nickel is printed on the supporting member 10 molded of plastic. That is, the position detection pattern 12 may be configured in a manner of molded interconnect device (MID). The position detection pattern 12 may be formed on the supporting member 10 in a manner of being plated or stamped in addition to being printed.

Alternatively, the position detection pattern 12 may be detachably mounted on the supporting member 10 of the fixing member 2. In more detail, the position detection pattern 12 is formed on a position detection substrate (not shown) which is detachably mounted on the supporting member 10, and a mounting unit (not shown) which detachably mounts the position detection substrate is formed on the supporting member 10.

The rotating member 3 is rotatably mounted on the fixing member 2, and a user manipulates the rotating member 3 to adjust a zoom lens. The rotating member 3 includes the first and second electric conductivity units 41, 42 and the knob 50.

The first and second electric conductivity units 41, 42 allow electricity to flow selectively between the position detection points 0, L1, L2, L3, L4, R1, R2, R3, R4 and the left and right grounds LG, RG on the position detection pattern 12 of the supporting member 12, and are mounted on a rotating wing 40. The rotating wing 40 extends vertically from the shaft 30 which is rotatably mounted in the shaft hole 13 of the supporting member 10. Therefore, the shaft 30 may rotate vertically with respect to the flat unit 11 of the supporting member 10, and if the shaft 30 rotates, the rotating wing 40 configured integrally with the shaft 30 rotates opposite the flat unit 11 of the supporting member 10.

Figure 7:
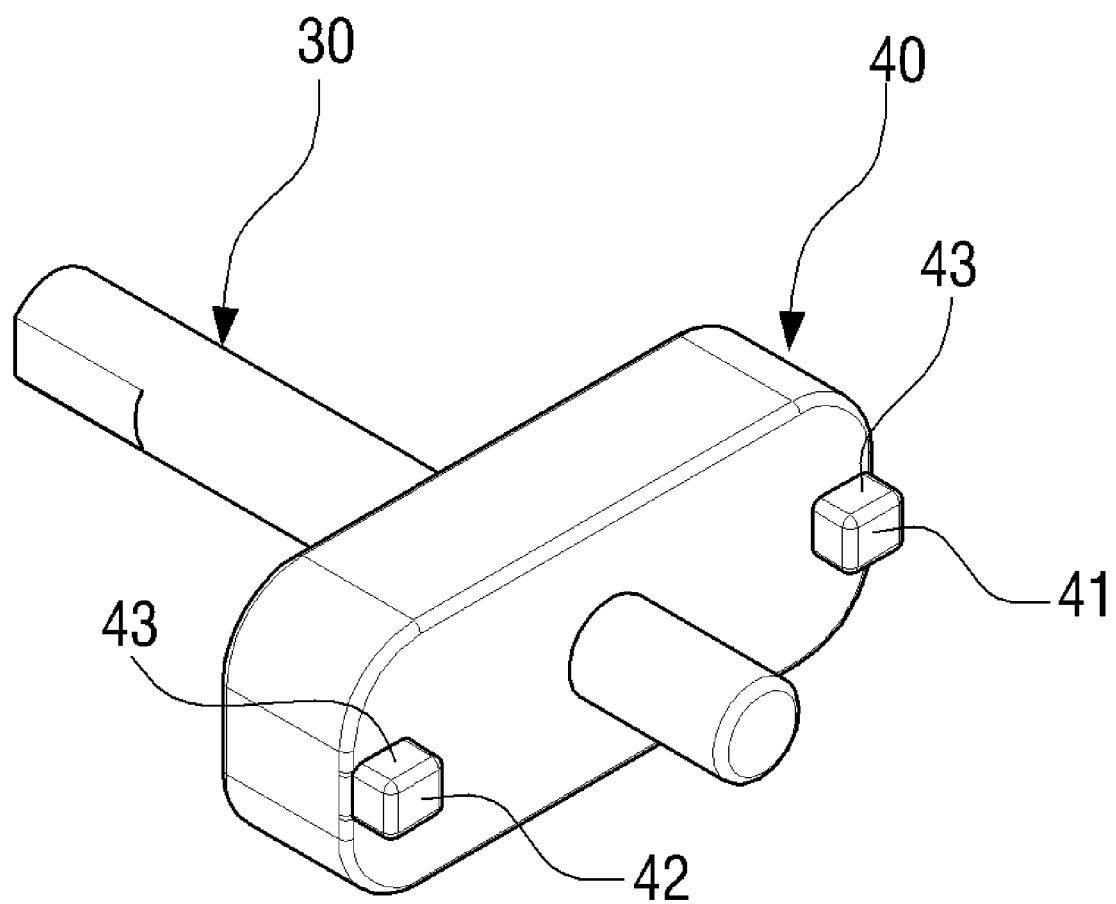
FIG. 7 is a perspective view illustrating a shaft of the zoom switch assembly of FIG. 1.

In this exemplary embodiment of the present general inventive concept, the rotating wing 40 is configured in a substantial rectangular bar shape having a lengthwise axis that extends perpendicular to the shaft 30 as illustrated in FIG. 7, and the two electric conductivity units 41, 42 are formed on a surface of the rotating wing 40 opposite the supporting member 10. The two electric conductivity units 41, 42 may be symmetrical to each other and may be positioned the same distance from the shaft 30. Therefore, if the shaft 30 rotates, the first and second electric conductivity units 41, 42 may draw a circular trace to be opposed to the supporting member 10. The first and second electric conductivity units 41, 42 may be formed on a protrusion 43 that protrudes from the rotating wing 40 at a predetermined height as illustrated in FIG. 7. The electric conductivity units 41, 42 may be formed in such a manner of being printed using a metal material such as nickel. The electric conductivity units 41, 42 may be fabricated using the same metal material as the position detection pattern 12 of the supporting member 10. The rotating wing 40 and the shaft 30 may be molded, and the electric conductivity units 41, 42 may be formed in such a manner that a metal material is printed on protrusions 43 of the rotating wing 40. The electric conductivity units 41, 42 may be formed in an MID manner which is the same as that of the position detection pattern 12. The electric conductivity units 41, 42 may also be formed by plating or stamping.

The electric conductivity units 41, 42 may be formed to connect the left and right grounds LG, RG of the supporting unit 10 to at least one of the plurality of position detection points 0, L1, L2, L3, L4, R1, R2, R3, R4. By doing so, electricity flows through the position detection points 0, L1, L2, L3, L4, R1, R2, R3, R4 connected to the left and right grounds LG, RG by the electric conductivity units 41, 42, and thus the control unit 190 determines which position detection point among the position detection points 0, L1, L2, L3, L4, R1, R2, R3, R4 is connected to the left and right grounds LG, RG. In this exemplary embodiment of the present general inventive concept, each four position detection points L1, L2, L3, L4, and R1, R2, R3, R4 are disposed on the left and right sides with respect to the shaft 30. Therefore, the control unit 190 may detect the rotation direction of the knob 50 and the rotation position at each 5 degrees.

An end of the shaft 30 is supported by the shaft hole 13 of the supporting member 10, and the other end thereof is supported by a subsidiary supporting member 60. Referring to FIG. 2, the subsidiary supporting member 60 is mounted on the base 20 to be opposed to the flat unit 11 of the supporting member 10. To fix the subsidiary supporting member 60 on the base 20, a plurality of pins 23 to fix the subsidiary supporting member 60 are formed on the base 20, and a plurality of holes into which the pins 23 are inserted are formed on the subsidiary supporting member 60. An elastic member 31 presses the rotating wing 40 toward the supporting member 10, and thus the electric conductivity units 41, 42 maintain a firm contact with the position detection pattern 12 of the supporting member 10. The elastic member 31 is mounted on the shaft 30 between the subsidiary supporting member 60 and the rotating wing 40. A compression coil spring may be used as the elastic member 31.

The knob 50 is configured to rotate integrally with the shaft 30, and is disposed to rotate with respect to the supporting member 10. The knob 50 may be formed in various shapes to be manipulated easily by a user. The knob 50 according to an exemplary embodiment of the present general inventive concept is configured in an oblong shape to correspond to the length of the shaft 30 in order to cover the shaft 30. A stopper 51 is formed on an end of the knob 50 to restrict a rotation angle of the knob 50 by contacting the base 20.

If a user rotates the knob 50, the shaft 30 also rotates together with the knob 50, and if the shaft 30 rotates, the rotating wing 40 configured integrally with the shaft 30 also rotates. In addition, the rotation of the rotating wing 40 causes the electric conductivity units 41, 42 to rotate and thus to change some of the position detection point 0, L1, L2, L3, L4, R1, R2, R3, R4 to be connected to the left and right grounds LG, RG by the electric conductivity units 41, 42.

Figure 8:
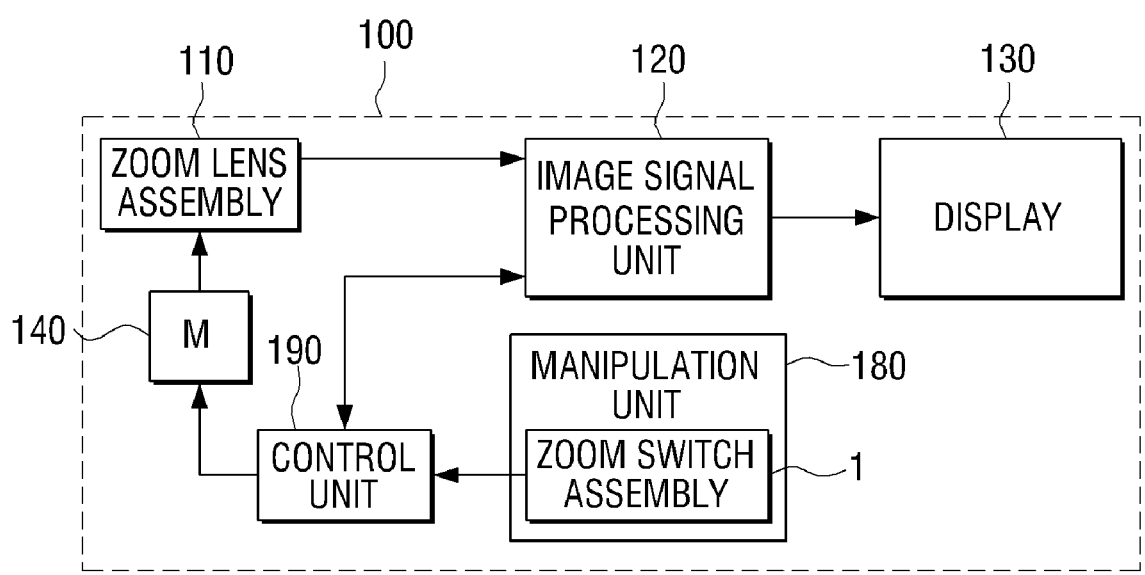
FIG. 8 is a functional block diagram illustrating an image photographing apparatus having a zoom switch assembly according to an exemplary embodiment of the present general inventive concept.

FIG. 8 is a functional block diagram illustrating the image photographing apparatus 100 having a zoom switch assembly 1 according to an exemplary embodiment of the present general inventive concept.

Referring to FIG. 8, the image photographing apparatus 100 includes the zoom lens assembly 110, an image signal processing unit 120, a manipulation unit 180, and a control unit 190.

The zoom lens assembly 110 receives light reflected from an object, forms an image on a photoconductive surface of an image sensor of the image signal processing unit 120. The zoom lens assembly 110 performs tele/wide (T/W) operation, and adjusts automatically a focus according to a signal of the control unit 190.

The image signal processing unit 120 converts an optical image of the object formed on the image sensor into an electrical signal according to a signal of the control unit 190, and outputs the image to a display 130.

The manipulation unit 180 is a user interface to receive a command to select functions or to control operations of the image photographing apparatus 100. The manipulation unit 180 includes the zoom switch assembly 1.

The zoom switch assembly 1 enables a user to photograph a desired image using the T/W operation of the zoom lens assembly 110. The zoom switch assembly 1 includes the fixing member 2 and the rotating member 3. The structure of the zoom switch assembly 1 has been described above, and detailed description will be omitted.

The control unit 190 controls overall operations of the image photographing apparatus 100 according to a command input by a user using the manipulation unit 180. This exemplary embodiment of the present general inventive concept may use the conventional technology that the control unit 190 controls the image signal processing unit 120 to output an image of an object on the display 130 and to store the image in a memory. Therefore, detailed description thereof will be omitted.

The control unit 190 detects the position of the rotating member 3 of the zoom switch assembly 1, and then controls the zoom lens assembly 110. In this case, the control unit 190 may include a memory which stores the plurality of position detection points 0, L1, L2, L3, L4, R1, R2, R3, R4 where the rotating member 3 can be positioned, and values to control a zoom motor M (140) to correspond to the position detection points 0, L1, L2, L3, L4, R1, R2, R3, R4. The values to control the zoom motor M (140) may be stored in a look-up table. As an example of the value to control the zoom motor M (140), the plurality of position detection points 0, L1, L2, L3, L4, R1, R2, R3, R4 correspond the speed of the zoom motor M (140), and the left and right position detection points L1, L2, L3, L4, R1, R2, R3, R4 correspond to the rotation direction of the zoom motor M (140). That is, the speed of the zoom motor M (140) is divided into four steps, and each of the left position detection points L1, L2, L3, L4, and each of the right position detection points R1, R2, R3, R4 correspond to the four steps of the speed. For instance, the maximum speed of the zoom motor M (140) corresponds to the fourth position detection points L4, R4, ¾ of the maximum speed corresponds to the third position detection points L3, R3, ½ of the maximum speed corresponds to the second position detection points L2, R2, and ¼ of the maximum speed corresponds to the first position detection points L1, R1. In addition, if it is detected that electricity flows on the left position detection points L1, L2, L3, L4, the zoom motor M (140) is set to rotate in a counter-clockwise direction, and if it is detected that electricity flows on the right position detection points R1, R2, R3, R4, the zoom motor M (140) is set to rotate in a clockwise direction. Therefore, if the control unit 190 determines that the knob 50 of the rotating member 3 is positioned on the second position detection point L2, the control unit 190 controls the zoom motor M (140) to rotate in a counter-clockwise direction at ¾ of the maximum speed of the motor M (140). The above setting of the rotation speed and the rotation direction of the zoom motor M (140) is merely an example, and the setting may be changed as occasion demands.

Hereinbelow, the method by which the control unit 190 of the image photographing apparatus 100 detects the position of the rotating member 3 of the zoom switch assembly 1 and controls the zoom lens assembly 110 will be explained with reference to FIGS. 1 and 8 to 11.

The control unit 190 recognizes the position of the knob 50 of the rotating member 3 of the zoom switch assembly 1 by determining which position detection point among the position detection points 0, L1, L2, L3, L4, R1, R2, R3, R4 is connected to the grounds LG, RG of the position detection pattern 10 of the zoom switch assembly 1, and then controls the zoom motor M (140) of the zoom lens assembly 110 according to the determination, which will be explained below.

When a user does not manipulate the knob 50 of the rotating member 3 of the zoom switch assembly 1, the first electric conductivity unit 41 of the rotating member 3 is positioned between the left uppermost position detection point 0 (hereinbelow, referred to as origin position detection point) and the left ground LG as illustrated in FIG. 9, and causes the origin position detection point 0 and the left ground LG to be electrically connected. If electricity flows between the origin position detection point 0 and the left ground LG, the control unit 190 determines that the knob 50 of the rotating member 3 is positioned on the origin, and thus retains the zoom lens assembly 110 as its current state.

If a user rotates the knob 50 of the rotating member 3 of the zoom switch assembly 1 in a specific direction (the direction indicated by arrow A of FIG. 10) to use the telescopic function, the first electric conductivity unit 41 of the rotating member 3 may electrically connect one of the left position detection points L1, L2, L3, L4 to the left ground LG so that electricity can flow therebetween as illustrated in FIG. 10. For instance, if the first electric conductivity unit 41 is positioned between the left first position detection point L1 and the left ground LG, electricity can flow between the left first position detection point L1 and the left ground LG. If electricity flows on the left first position detection point L1, the control unit 190 determines that the knob 50 of the rotating member 3 rotates in a counter-clockwise direction at 5 degrees, and controls the zoom motor M (140) to correspond to the determination. That is, the control unit 190 searches for the value to control the zoom motor M (140) corresponding to the left first position detection point L1 in the memory, and then controls the zoom motor M according to the searched value. If the value to control the speed of the zoom motor M (140) is stored in the memory as described above, the control unit 190 controls the zoom motor M (140) to rotate in a counter-clockwise direction at ¼ of the maximum speed.

If a user further rotates the knob 50 in the same direction, and thus the first electric conductivity unit 41 is electrically connected to one of the left second, third, and fourth position detection points L1, L2, L3, L4, the control unit 190 controls the zoom motor M (140) to correspond to the value of the electrically connected position detection point. When the first or second electric conductivity unit 41, 42 of the rotating member 3 causes the plurality of position detection points L1, L2, L3, L4, R1, R2, R3, R4, to be sequentially electrically connected, the control unit 190 may be set to control the zoom motor M (140) using the control value corresponding to the position detection point finally electrically connected. For example, if the first electric conductivity unit 41 has passed through the first and second position detection points L1, L2 already, and has not passed through the third position detection point L3 yet, the control unit 190 controls the zoom motor M (140) using the control value corresponding to the second position detection point K2.

Figure 11:
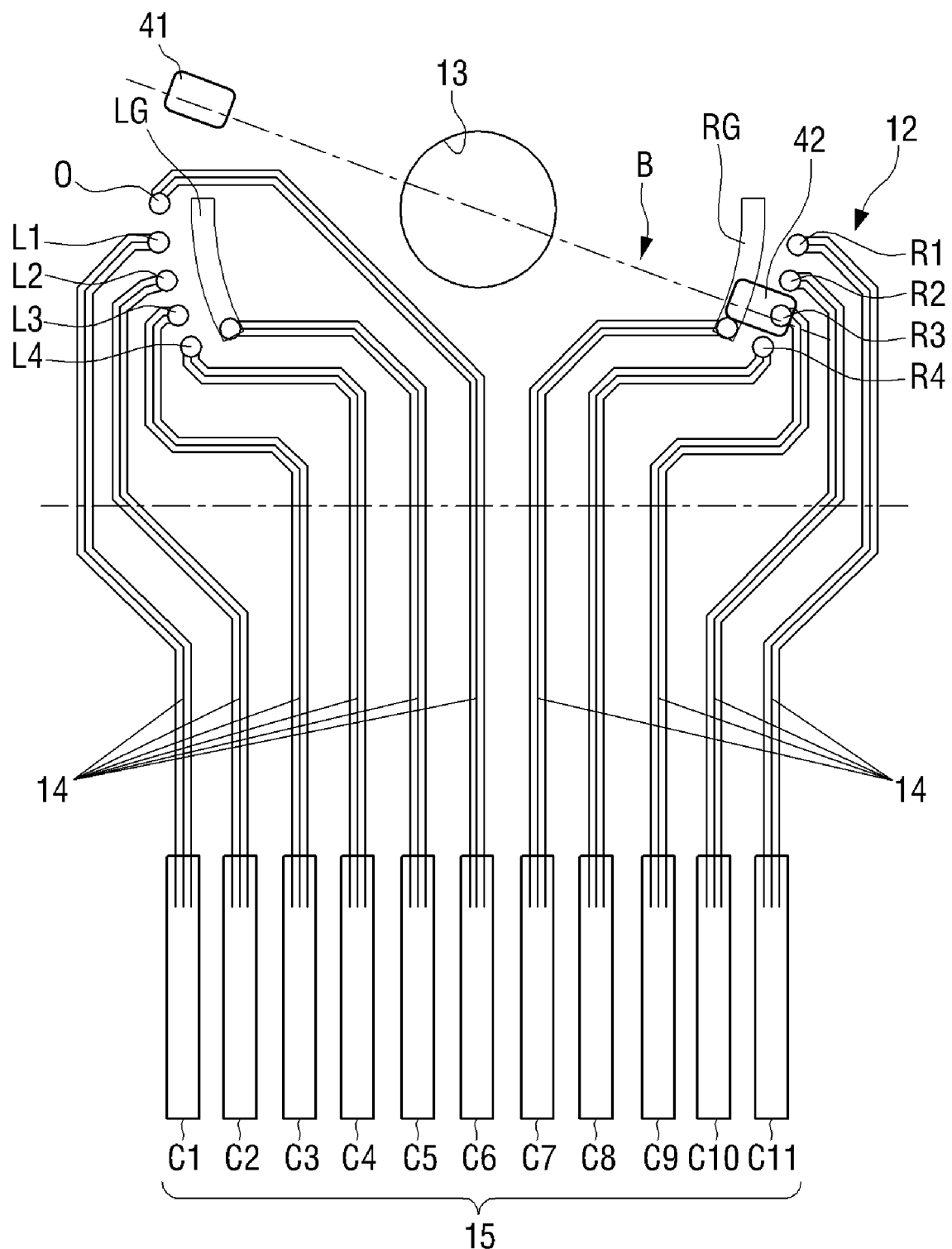
FIG. 11 is a view illustrating the relationship between a position detection pattern and an electric conductivity unit when a knob performs a wide function in a zoom switch assembly according to an exemplary embodiment of the present general inventive concept.

If a user rotates the knob 50 of the rotating member 3 of the zoom switch assembly 1 in a reverse direction (the direction indicated by arrow B of FIG. 11) to use the wide function, the second electric conductivity unit 42 of the rotating member 3 may cause one of the right position detection points R1, R2, R3, R4 and the right ground RG to be electrically connected as illustrated in FIG. 11. For instance, if the second electric conductivity unit 42 is positioned between the right third position detection point R3 and the right ground RG as illustrated in FIG. 11, electricity can flow between the right third position detection point R3 and the right ground RG. If electricity flows through the right third position detection point R3, the control unit 190 determines that the knob 50 of the rotating member 3 rotates in a clockwise direction by 15 degrees, and controls the zoom motor M (140) to correspond to the determination. In the case that the value to control the zoom motor M (140) is stored in the memory of the control unit 190, if it is determined that the second electric conductivity unit 42 causes electricity to flow between the right third position detection point R3 and the right ground RG, the control unit 190 rotates the zoom motor M (140) in a clockwise direction at ¾ of the maximum speed.

As described, if the zoom switch assembly 1 according to this exemplary embodiment of the present general inventive concept is used, the control unit 190 determines the position of the knob 50 of the rotating member 3 according to electric flow of the position detection pattern 12 of the fixing member 2, and controls the zoom motor M (140) according to the determination. That is, the control unit 190 determines through which position detection point among the plurality of position detection points 0, L1, L2, L3, L4, R1, R2, R3, R4 the rotating member 3 causes electricity to flow, and controls the zoom motor M using the control value corresponding to the determined position detection point.

Figure 12:
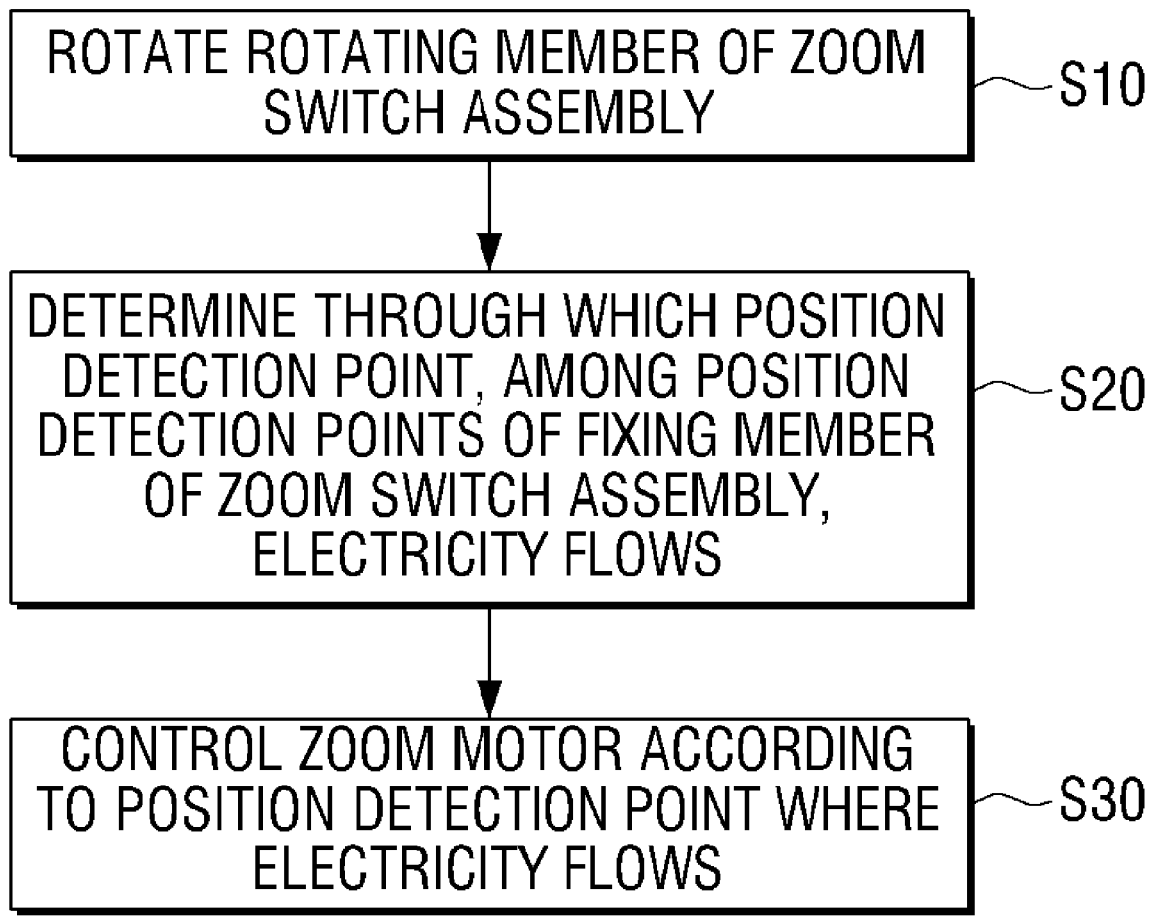
FIG. 12 is a flowchart provided to explain the method of controlling a zoom lens according to an exemplary embodiment of the present general inventive concept.

Hereinbelow, the method of controlling a zoom lens of an image photographing apparatus according to an exemplary embodiment of the present general inventive concept will be explained with reference to FIGS. 8 and 12.

A user adjusts the position of the zoom lens of the zoom lens assembly 110 of the image photographing apparatus 100 in order to photograph an object in a desired size. To do so, the user rotates the rotating member 3 of the zoom switch assembly 1 in operation S10.

The control unit 190 of the image photographing apparatus 100 determines the degree of rotation of the rotating member 3 in operation S20. In this exemplary embodiment of the present general inventive concept, the control unit 190 determines the position of the rotating member 3 by determining on which position detection point among the plurality of position detection points 0, L1, L2, L3, L4, R1, R2, R3, R4 electricity flows in operation S20. That is, the control unit 190 determines the position of the rotating member 3 by determining through which contact point among the contact points C5, C6 corresponding to the left and right grounds LG, RG, and the contact points C1, C2, C3, C4, C7, C8, C9, C10, C11 corresponding to the position detection points 0, L1, L2, L3, L4, R1, R2, R3, R4 electricity flows.

In operation S30, the control unit 190 controls the zoom motor M (140) according to the position detection point where electricity flows. That is, the control unit 190 reads out the control value corresponding to the contact point where electricity flows among the nine contact points C6, C1, C2, C3, C4, C8, C9, C10, C11 from the memory, and controls the motor M (140) according to the control value. In this situation, the control unit 190 may control the rotation speed and the rotation direction of the zoom motor M differently according to the position detection point L1, L2, L3, L4, R1, R2, R3, R4 where electricity flows.

If a user adjusts the zoom lens assembly 110 using the zoom switch assembly 1, an image of an object is output to the display 130 through the image signal processing unit 120. Therefore, the user may appropriately adjust the zoom lens while viewing the image output on the display 130. If the user presses the shutter of the manipulation unit 180 after completing the adjustment of the zoom lens, the image of the object may be stored in the memory through the image signal processing unit 120.

FIGS. 13A-13D illustrate configurations of the ground pads RG and LG and the position detection points according to embodiments of the present general inventive concept.

Figure 13A:
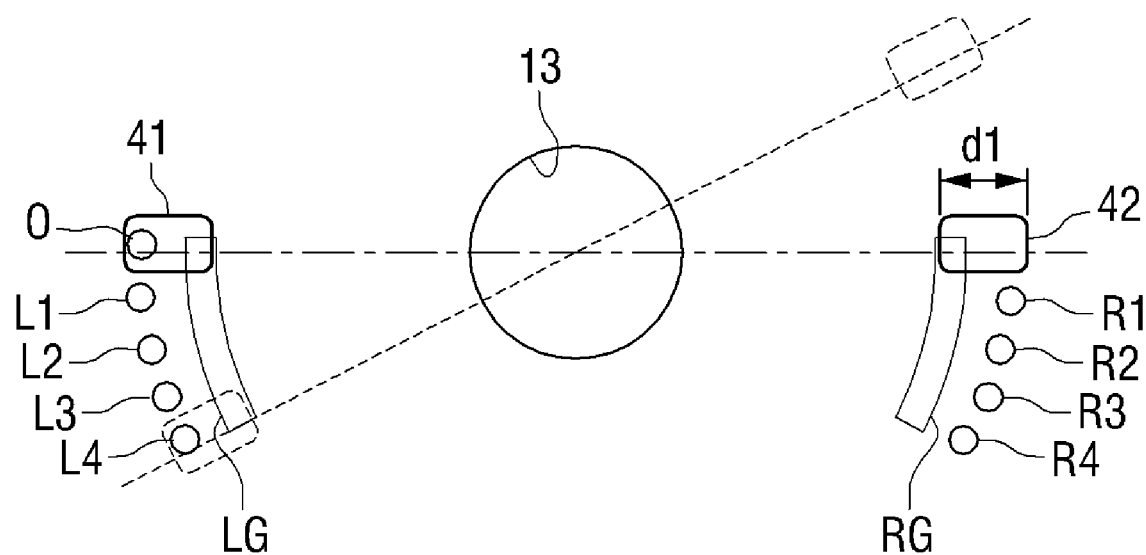
FIGS. 13A-13D illustrate configurations of a position detection pattern according to embodiments of the present general inventive concept.

FIG. 13A illustrates a configuration of ground pads RG and LG and detection points R1-R4, L1-L4, and 0 similar to that of FIGS. 9-11. The detection points R1-R4 and L1-L4 may be located equal distances apart from the shaft hole 13 on opposite sides of the shaft hole 13. The ground pads RG and LG may be located between the detection points R1-R4 and L1-L4 and the shaft hole 13 and may be positioned adjacent to and spaced apart from the detection points R1-R4 and L1-L4 so that as the first and second electric conductivity units, or conductive units, 41 and 42, are rotated about the shaft 30 in the shaft hole 13, one of the conductive units 41 and 42 connects corresponding ground pads RG and LG with a corresponding detection point R1-R4 or L1-L4. Alternatively, when the shaft 30 is in a rest state or a non-rotated state, one of the conductive units 41 and 42 may connect the origin position detection point 0 and a corresponding ground pad RG or LG. In FIG. 13A, for example, the first conductive unit 41 connects the origin position detection point 0 to the left ground pad LG.

As illustrated in FIG. 13A, the detection points R1-R4, L1-L4, and 0 may be positioned at substantially equal distances around the shaft hole 13 along arcs. The ground pads RG and LG may also form arcs and may comprise contiguous pads so that one ground pad RG or LG may be consecutively connected to respective detection points R1-R4, L1-L4, and 0 as the shaft 30 and the conductive units 41 and 42 rotate. However, the right side detection points R1-R4 need not necessarily be a same distance from the shaft hole 13 as the left side detection points L1-L4. For example, the right ground pad RG and the right side detection points R1-R4 may be closer to the shaft hole 13 than the left side ground pad LG and detection points L1-L4 and 0. Accordingly, the first conductive unit 41 would be farther from the shaft hole 13 than the second conductive unit 42.

While nine detection points are illustrated in FIG. 13A, any number of detection points may be utilized according to a desired number of different voltages to be generated. In addition, the conductive units 41 and 42 may have a length d1 sufficient to contact each of the ground pads RG and LG to corresponding detection points R1-R4 and L1-L4 and 0 as the shaft rotates.

Figure 13B:
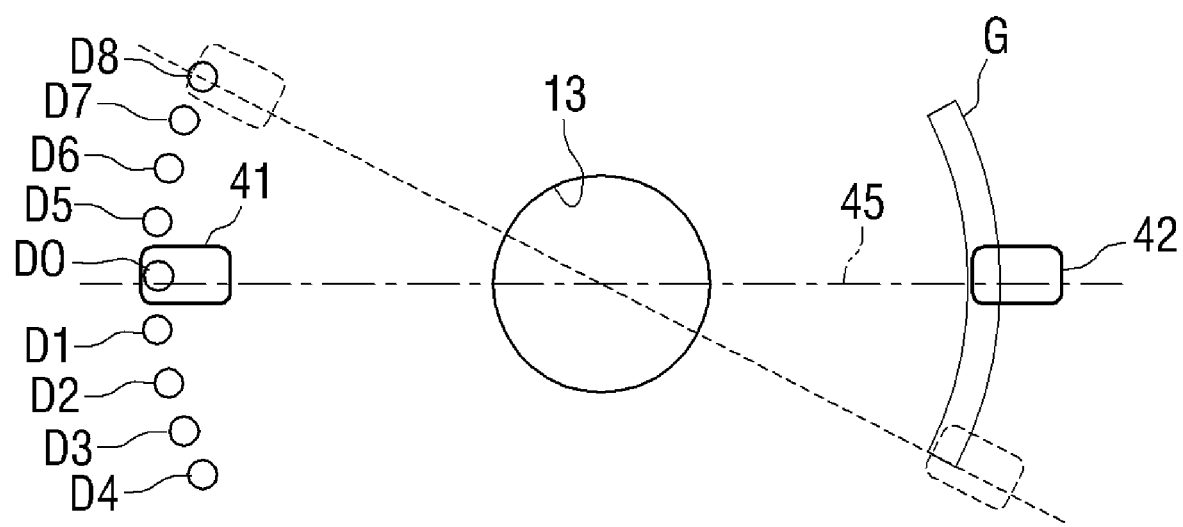

FIG. 13B illustrates an embodiment in which a plurality of detection points D1-D8 and D0 are arranged to be equidistant from the shaft hole 13 on one side of the shaft hole, and the ground pad G is arranged as an arc on the opposite side of the shaft hole 13. A wire 45 or conductive line may connect the first and second conductive units 41 and 42 to generate a voltage flow to correspond to a connection line 14 (not shown in FIG. 13B) of a corresponding detection point D1-D8 or 0.

Figure 13C:
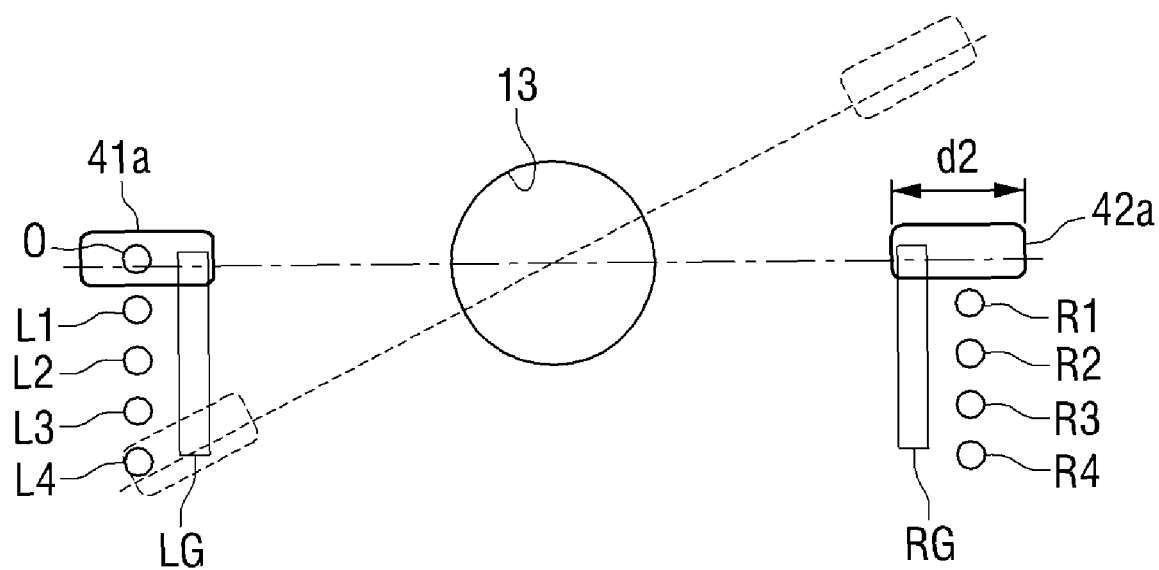

FIG. 13C illustrates an embodiment of the present general inventive concept in which the detection points on each side of the shaft hole 13 may be located at different distances from the detection points on the same side of the shaft hole 13. For example, as illustrated in FIG. 13C, the detection points L1-L4 may be arranges substantially along a straight line and the detection points R1-R4 may also be arranged along a line on an opposite side of the shaft hole 13. The ground pads LG and RG may be arranged in a line between the detection points L1-L4 and R1-R4 and the shaft hole 13. The first and second conductive units 41a and 42a may have a length d2 that is longer than the length of the first and second conductive units 41 and 42 of FIG. 13A, so that an inner portion of the conductive units 41a and 42a may connect the detection points L1 and R1 to the respective ground pads LG and RG when the shaft 30 is in or near a rest state and the outer portion of the conductive units 41a and 42a may connect the detection points L4 and R4 to the respective ground pads LG and RG when the shaft is rotated to be farthest from the rest state.

Figure 13D:
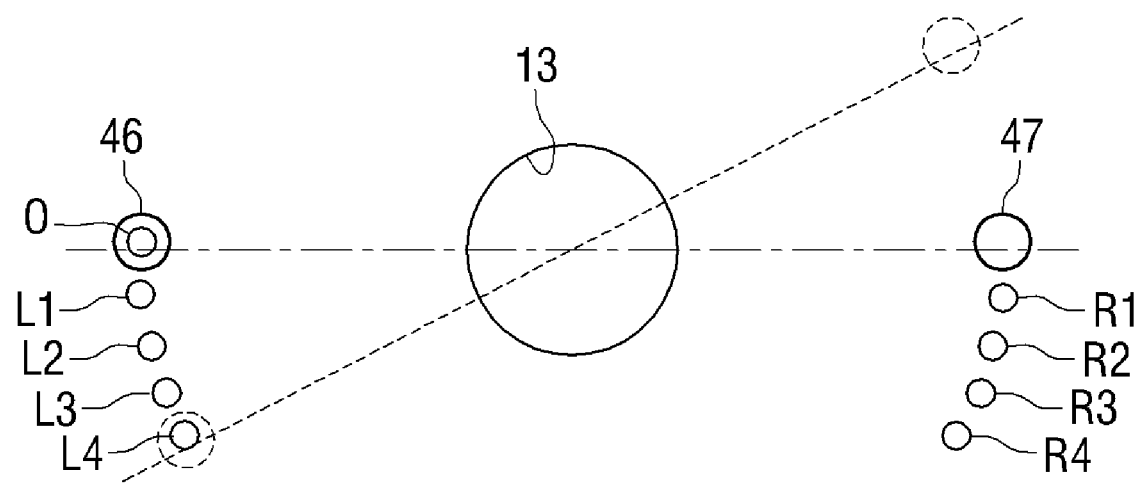

FIG. 13D illustrates an embodiment of the present general inventive concept in which a voltage may be generated by the interaction between a sensor 46 or 47 with a corresponding detection point 0, L1-L4, or R1-R4. In particular, the detection points may include optical, magnetic, or other patterns printed or formed on or in the flat unit 11. The flat unit 11 may be a circuit board or other substrate, or may include a plurality of materials such as a circuit board mounted to a flat surface. The sensors 46 or 47 may include magnetic or optical sensors to detect a unique pattern, such as an intensity, composition, density, or other characteristic of a respective detection point 0, L1-L4, or R1-R4, may communicate the detected characteristic to the control unit 190, and the control unit 190 may control the zoom lens assembly 110 according to the detected characteristic.

For example, if the detection points L1-L4 include an optically-reflective material and each detection point L1-L4 includes the material in a different density, then the optical sensor 46 may transmit light and detect the intensity of light reflected from the corresponding detection point L1-L4 and output a corresponding voltage to the control unit 190. According to this embodiment, the structure of the zoom switch assembly 1 is similar to that of FIGS. 1-6, except no connection lines 14 are necessary to connect the connection points to the control unit 190. Instead, the sensors 46 and 47 communicate with the control unit 14 via wires, for example. Alternatively, the detection points may be located on the rotating wing 40 connected to the shaft 30, and the sensors 46 and 47 may be located on the flat unit 11.

In addition, because the sensors 46 and 47 generate a voltage based on a characteristic of the detection points L1-L4 and R1-R4, no ground pads LG and RG are needed.

The zoom switch assembly according to the exemplary embodiment of the present general inventive concept may determine the position of the knob of the rotating member by checking whether electricity flows on the circuit forming the position detection pattern or not, instead of checking the resistance of a resistor. Therefore, even when a user uses the zoom switch assembly for long periods of time, the position of the knob of the rotating member is accurately recognized.

The zoom switch assembly according to the exemplary embodiment of the present general inventive concept uses the electric conductivity unit and the position detection pattern which are made of the same material. Therefore, the friction between the electric conductivity and the position detection pattern does not cause the position detection pattern to be scratched.

The zoom switch assembly according to the exemplary embodiment of the present general inventive concept does not employ the conventional resistance method, and thus it is not necessary to assembly a brush using additional modules. Therefore, a small number of components are required, and it is easy to assemble the components.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A zoom switch assembly for an image photographing apparatus, comprising:
    a fixing member which includes a flat unit which extends substantially perpendicularly from the fixing member;
    a rotating member which is rotatable with respect to the fixing member;
    an electric conductivity unit which is mounted on the rotating member to rotate opposite the flat unit; and
    a position detection pattern which is formed along a rotation trace of the electric conductivity unit on the flat unit of the fixing member, and on which electricity flows selectively via the electric conductivity unit according to a rotation angle of the electric conductivity unit.

2. The zoom switch assembly for the image photographing apparatus of claim 1, wherein the position detection pattern comprises:
    a ground located on the flat unit at a location that corresponds to one end of the electric conductivity unit; and
    a plurality of position detection points located on the flat unit at a location that corresponds to the other end of the electric conductivity unit, and spaced apart from the ground,
    wherein the electric conductivity unit causes electricity to flow between at least one of the plurality of position detection points and the ground.

3. The zoom switch assembly for the image photographing apparatus of claim 2, wherein the rotating member includes a shaft to rotate within a shaft hole of the fixing member, and
    the plurality of position detection points are formed at intervals of 5 degrees with respect to a center of the shaft hole.

4. The zoom switch assembly for the image photographing apparatus of claim 1, wherein the fixing member comprises:
    a supporting member on which the flat unit is formed; and
    a base which fixes the supporting member.

5. The zoom switch assembly for the image photographing apparatus of claim 4, wherein the rotating member comprises:
    a shaft which is mounted rotatably on the flat unit to extend perpendicularly from the flat unit;
    a rotating wing which protrudes from the shaft and supports the electric conductivity unit; and
    a knob to rotate integrally with the shaft.

6. The zoom switch assembly for the image photographing apparatus of claim 5, wherein the rotating wing is formed via molding, and the electric conductivity unit is formed by printing metal material on the rotating wing.

7. The zoom switch assembly for the image photographing apparatus of claim 1, wherein the fixing member is formed via molding, and the position detection pattern is formed by printing metal material on the flat unit of the fixing member.

8. The zoom switch assembly for the image photographing apparatus of claim 1, wherein the position detection pattern is formed on a position detection substrate, and the position detection substrate is detachably mounted on the flat unit of the fixing member.

9. A zoom switch assembly for an image photographing apparatus, comprising:
    a supporting member including a flat unit;

a shaft rotatably mounted on the flat unit to extend perpendicularly from the flat unit;

a knob to rotate integrally with the shaft and to rotate with respect to the supporting member;

a position detection pattern formed on the flat unit of the supporting member, and comprises at least two grounds and a plurality of position detection points, wherein the grounds are formed in a circular arc shape to surround the shaft, and the plurality of position detection points are formed apart from the grounds in the radial direction of the shaft, and are formed apart from each other in the circumferential direction of a circle having the shaft as a center; and a rotating wing to rotate integrally with the shaft and including an electric conductivity unit to electrically connect at least one of the grounds with at least one of the plurality of position detection points of the position detection pattern, wherein if the knob rotates, the electric conductivity unit rotates, and thus changes, among the plurality of position detection points, the position detection point which is connected to the ground.

10. The zoom switch assembly for the image photographing apparatus of claim 9, wherein the position detection pattern is symmetrical with respect to a line which passes through the shaft, and divides the flat unit in half.

11. The zoom switch assembly for the image photographing apparatus of claim 10, wherein the rotating wing is symmetrical with respect to the shaft, and the two electric conductivity units are symmetrical with respect to the shaft.

12. The zoom switch assembly for the image photographing apparatus of claim 9, further comprising:

a subsidiary supporting member mounted to be opposed to the flat unit of the supporting member, the flat unit supporting one end of the shaft and the subsidiary supporting member supporting the other end of the shaft; and a base mounted below the supporting member and the subsidiary supporting member.

13. The zoom switch assembly for the image photographing apparatus of claim 9, further comprising:

an elastic member to press the electric conductivity unit toward the flat unit of the supporting member.

14. The zoom switch assembly for the image photographing apparatus of claim 9, wherein the position detection pattern is formed via one of printing, plating, and stamping.

15. An image photographing apparatus, comprising:
a body of the image photographing apparatus;
a zoom lens assembly mounted on the body;
a zoom motor mounted on the body to drive the zoom lens assembly;
a zoom switch assembly mounted on the body,
wherein the zoom switch assembly comprises:
  a fixing member which includes a flat unit which extends substantially perpendicularly from the fixing member;
  a rotating member rotatably mounted with respect to the fixing member;
  an electric conductivity unit mounted on the rotating member to rotate opposite the flat unit; and
  a position detection pattern located on the flat unit of the fixing member along a rotation trace of the electric conductivity unit, and on which electricity flows selectively according to a rotation angle of the electric conductivity unit; and
a control unit mounted on the body to detect the position of the electric conductivity unit of the zoom switch assembly, and to control the zoom motor according to the position of the electric conductivity unit.

16. A method of controlling a zoom lens of an image photographing apparatus, the method comprising:

causing a rotating member of a zoom switch assembly to rotate;

determining through which position detection point, among a plurality of position detection points of a fixing member of the zoom switch assembly that includes a flat unit which extends substantially perpendicularly from the fixing member, the plurality of position detection points formed apart from each other in a circumferential direction of a circle on the flat unit of the fixing member, electricity flows; and controlling a zoom motor according to the position detection point through which electricity flows.

17. The method of claim 16, wherein the rotation speed and the rotation direction of the zoom motor are controlled according to the position detection point on which electricity flows.

18. An image zoom switch of an image capture apparatus, comprising:

a base mounted to the image capture apparatus;

a first surface that is fixed with respect to the image capture apparatus and is a substantially flat surface that extends substantially perpendicularly from the base; and a second surface opposite the first surface to rotate with respect to the first surface; and wherein one of the first and second surfaces includes a position detection pattern including a plurality of position detection points and at least one ground pad, and the position detection pattern is located on the first surface and the at least one electrically conductive unit is located on the second surface, and the other of the first and second surfaces includes at least one electrically conductive unit to connect the detection points to the at least one ground pad, respectively, such that a different detection point is connected to the at least one ground pad when the second surface is at a different rotation angle with respect to the first surface.

19. The image zoom switch according to claim 18, wherein the base is mounted to the image capture apparatus so that a lower surface of the base contacts the image capture apparatus, and the first surface includes electrically conductive connection lines extending from each of the plurality of position detection points and from the at least one ground pad to respective contact points located on a lower surface of the base.

20. The image zoom switch according to claim 18, further comprising:

a shaft mounted to one of the first and second surfaces to extend substantially perpendicularly from the one of the first and second surfaces, wherein the other of the first and second surfaces includes a hole to receive the shaft, and the shaft rotates within the hole.

21. The image zoom switch according to claim 20, wherein the position detection pattern includes a plurality of first position detection points and a first ground pad located on a first side of the first surface and a plurality of second position detection points and a second ground pad located on a second side of the first surface opposite the first side.

22. The image zoom switch according to claim 21, wherein the first position detection points and first ground pad are located on one side of the shaft and the second position detection points and the second ground pad are located on the other side of the shaft.

23. The image zoom switch according to claim 22, wherein the plurality of first and second detection points are located at equal distances from a center of the shaft.

24. The image zoom switch according to claim 22, wherein the first and second ground pads span a length corresponding to the plurality of first and second position detection points, respectively, such that the at least one electrically conductive unit contacts a different first or second detection point and a same first or second ground pad, respectively, as the second surface rotates with respect to the first surface.

25. The image zoom switch according to claim 22, wherein each of the first and second position detection points is located on a same side of an imaginary line bisecting the shaft.

26. The image zoom switch according to claim 25, wherein the position detection pattern further includes a rest state detection point located on the imaginary line, the rest state detection point being a different detection point than the first and second pluralities of detection points.

27. The image zoom switch according to claim 22, wherein each of the plurality of first detection points is located an equal distance from each adjacent first detection point and each of the plurality of second detection points is located an equal distance from each adjacent second detection point.

28. The image zoom switch according to claim 22, wherein the at least one electrically conductive unit includes a first electrically conductive unit to connect one respective first position detection point with the first ground pad, and a second electrically conductive unit to connect one respective second position detection point with the second ground pad.

29. The image zoom switch according to claim 28, wherein the first electrically conductive unit connects one respective first position detection point to the first ground pad when the second surface is rotated at a negative angle with respect to an imaginary line bisecting the shaft, and
the second electrically conductive unit connects one respective second position detection point to the second ground pad when the second surface is rotated at a positive angle with respect to the imaginary line.

30. The image zoom switch according to claim 18, further comprising:
a knob connected to and fixed with respect to the second surface, to receive a user force and to rotate the second surface in response to the received user force.

31. An image capture apparatus, comprising:
an image signal processing unit to receive light and to output an image signal corresponding to the received light;
a zoom lens unit to pass the received light from outside the image capture apparatus to the image signal processing unit via at least one lens;
a zoom switch unit to adjust a zoom of the zoom lens unit; and
a controller to receive a zoom input from the zoom switch unit and to control the zoom of the zoom lens according to the received zoom input,
wherein the zoom switch unit comprises:
a first surface that is fixed with respect to the image capture apparatus; and
a second surface opposite the first surface to rotate with respect to the first surface,
one of the first and second surfaces includes a position detection pattern including a plurality of position detection points and at least one ground pad, the one of the first and second surfaces including a flat unit that extends substantially perpendicularly from the one of the first and second surfaces, and
the other of the first and second surfaces includes at least one electrically conductive unit to connect the detection points to the at least one ground pad, respectively, where the detection points are formed apart from the at least one ground pad on the flat unit and are formed apart from each other in a circumferential direction of a circle, such that a different detection point is connected to the at least one ground pad when the second surface is at a different rotation angle with respect to the first surface.

32. The image capture apparatus according to claim 31, wherein the position detection pattern includes a plurality of first position detection points and a first ground pad located on a first side of the first surface,
the electrically conductive unit separately contacts each one of the plurality of first position detection points and contacts the first ground pad as the second surface is rotated with respect to the first surface, and
the controller adjusts a speed of a zoom function of the zoom lens based on which of the first position detection points is electrically connected to the first ground pad.

33. The image capture apparatus according to claim 32, wherein, when a rest state angle is defined as an angle at which the second surface is not rotated with respect to the first surface, the controller increases the speed of the zoom function of the zoom lens as the rotation angle of the second surface with respect to the first surface increases with respect to the rest state angle.

34. A method of controlling a zoom of an image capture apparatus that includes a first surface and a second surface opposite the first surface, the method comprising:
detecting an electrical connection between a ground pad and one of a plurality of position detection points that are formed apart from each other in a circumferential direction of a circle on a flat unit which extends substantially perpendicularly from one of the first surface and the second surface, and
outputting a zoom control signal based on the one of the plurality of position detection points connected to the ground pad.

35. The method according to claim 34, wherein the image capture apparatus comprises:
the first surface is fixed with respect to the image capture apparatus; and
the second surface is opposite the first surface to rotate with respect to the first surface,
and
the method further comprises:
when a rest state angle is defined as an angle at which the second surface is not rotated with respect to the first surface, outputting zoom control signal to increase a zoom rate as the rotation angle of the second surface with respect to the first surface increases with respect to the rest state angle.

36. The method according to claim 35, further comprising:
receiving a user input to rotate the second surface with respect to the first surface.

* * * * *